United States Patent
Okada (12) 
(10) Patent No.: US 6,459,474 B1
(45) Date of Patent: Oct. 1, 2002

(54) CONTACT EXPOSURE DEVICE PROVIDED WITH A MASK AND WORKPIECE INTERVAL SETTING MEANS

(75) Inventor: Syoichi Okada, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 14 days.

(21) Appl. No.: 09/694,030

(22) Filed: Oct. 23, 2000

(30) Foreign Application Priority Data

Oct. 26, 1999 (JP) ............................... 11-303600

(51) Int. Cl.$^7$ .................. G03B 27/02; G03B 27/58; G03B 27/62
(52) U.S. Cl. .................. 355/78; 355/72; 355/75
(58) Field of Search .................. 355/53, 72–76, 355/78, 95; 310/10, 12; 378/34, 35

(56) References Cited

U.S. PATENT DOCUMENTS

| | | | |
|---|---|---|---|
| 3,192,844 A | * 7/1965 | Szasz et al. | 355/78 |
| 4,431,304 A | * 2/1984 | Mayer | 355/54 |
| 4,576,475 A | 3/1986 | Kitagawa et al. | 355/91 |
| 5,323,712 A | 6/1994 | Kikuiri | 108/20 |
| 5,543,890 A | 8/1996 | Tanaka et al. | 355/53 |
| 5,660,381 A | * 8/1997 | Suzuki | 269/73 |
| 6,232,023 B1 | * 5/2001 | Matsuki et al. | 430/22 |

FOREIGN PATENT DOCUMENTS

| | | |
|---|---|---|
| EP | 0 489 426 | 6/1992 |
| EP | 0 633 505 | 1/1995 |
| EP | 0953878 A2 | * 3/1999 |
| EP | 0 953 878 | 11/1999 |
| GB | 1 406 406 | 9/1995 |

* cited by examiner

*Primary Examiner*—Russell Adams
*Assistant Examiner*—Hung Henry Nguyen
(74) *Attorney, Agent, or Firm*—Nixon Peabody LLP; David S. Safran (57) ABSTRACT

To provide a contact exposure device that does not require replacement of a interval setting means between a mask and workpiece, even if processing workpieces of different thickness, an interval setting device (10) between a mask and workpiece is provided which has an attachment member (10*a*) which is attached to a workpiece stage (WS) and a movable member (10*b*). The attachment member (10*a*) and the movable member (10*b*) are fitted together by screw threading. Consequently, the height can be adjusted by rotating the movable member (10*b*). The workpiece stage WS and a mask stage are separated from each other by a prescribed distance by the interval setting device (10), and the space between a mask and the workpiece (W) is depressurized. A gap is formed between the mask and workpiece (W) without contact even upon depressurization since the workpiece stage (WS) and the mask stage are separated a prescribed distance by the interval setting means (10). Workpiece (W) is floated using air in this state and exposure is carried out with the mask (M) adhered to workpiece (W).

3 Claims, 5 Drawing Sheets

CONTACT EXPOSURE DEVICE PROVIDED WITH A MASK AND WORKPIECE INTERVAL SETTING MEANS

BACKGROUND OF THE INVENTION

1. Field of the Invention

The present invention concerns a contact exposure device used in contact exposure processes, especially a contact exposure device for exposing a mask pattern on a workpiece like a flexible printed circuit (FPC) having polyimide properties that is thin and prone to cracking. More specifically, the invention relates to a contact exposure device provided with an interval setting means that separates and mutually faces a mask and workpiece so as to have a preset contact-free interval when pressure between a mask and workpiece is reduced.

2. Description of Related Art

Exposure processes in which light passing through a mask is irradiated on a workpiece to expose a mask pattern on a workpiece are carried out to form various types of electronic devices on a workpiece in the production of various electrical components that require microsize processing, such as semiconductor devices, liquid crystal substrates, micromachines, etc. Among aforementioned exposure methods, the contact exposure method is one that adheres a mask and workpiece and then copies a mask pattern onto the workpiece.

Figure 7A:
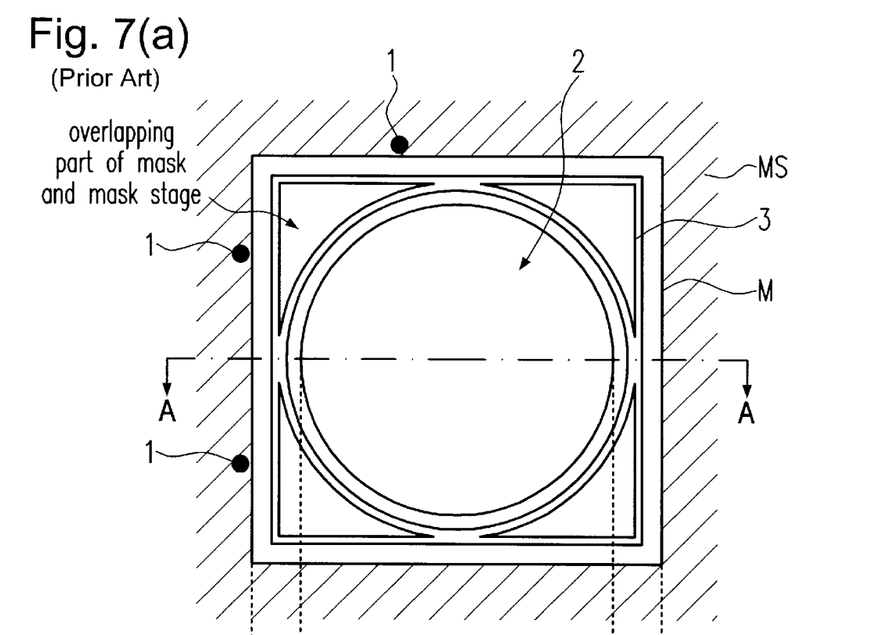
FIGS. 7(a) & 7(b) are plan and cross-sectional views, respectively, showing the structure of a known contact exposure device.
Figure 7B:
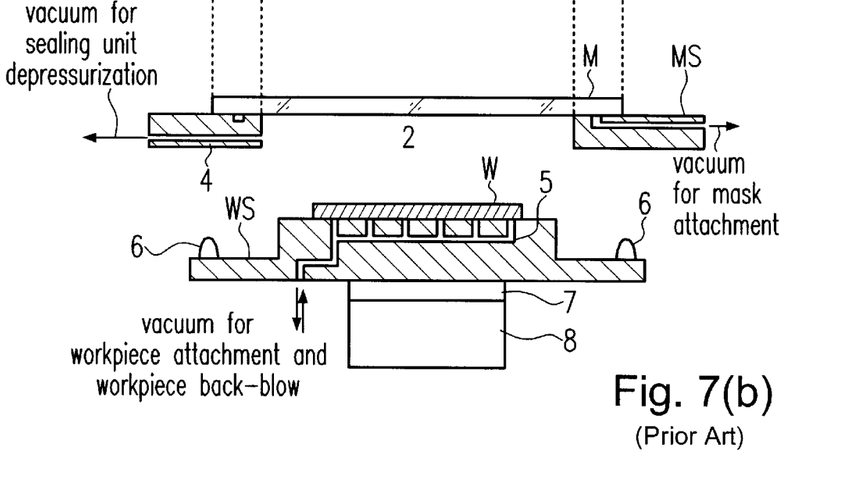

FIGS. 7(a) & 7(b) are diagrams showing the structure of a contact exposure device. The diagram shows the structure of a contact exposure device that adheres a mask and workpiece by applying force through decompression that pushes a photomask (hereinafter abbreviated mask M) and a workpiece W together, followed by exposure. FIG. 7(a) is a top view while FIG. 7(b) is a sectional view along line A—A of FIG. 7(a).

In the diagram, positioning member 1 of mask M is mounted on a mask stage MS and an aperture 2 is formed in mask stage MS so that exposure light from a photo-irradiation unit (not shown) will be irradiated on workpiece W through mask M.

Mask M on which a mask pattern is formed is brought into contact with the positioning member 1 and is laid on aperture 2 of mask stage MS. A vacuum groove 3 extends about the periphery of aperture 2 of mask stage MS, and mask M is attached/held by vacuum that is provided to vacuum groove 3 from a vacuum source (not shown). In addition, a conduit 4 for depressurization of the space that is formed by photomask M, mask stage MS, workpiece W, workpiece stage WS and vacuum seal unit 6 is provided in the mask stage MS.

A groove 5 for drawing a vacuum to attach workpiece W is formed in workpiece stage WS and the workpiece W that is placed on the workpiece stage WS is attached/held on the workpiece stage WS by vacuum that is supplied to vacuum groove 5 from a vacuum source (not shown). Vacuum seal unit 6 comprises a sealing member formed, for example, from rubber, that is mounted about the periphery of workpiece stage WS and is useful for creating a vacuum state to adhere mask M to workpiece W.

In addition, the workpiece stage WS is attached to workpiece stage drive mechanism 8 via interval setting groove 7. Workpiece stage drive mechanism 8 moves workpiece stage WS in the X direction (for example, left-right direction of FIG. 7(b)), Y direction (for example, perpendicularly to the plane of paper in FIG. 7(b)) and Z direction (up-down in FIG. 7(b)), and rotates workpiece stage WS about an axis perpendicular to the plane of workpiece W. The shape of workpiece stage W is usually created to match the shape of workpiece W. It is round if the workpiece is round and aperture 2 also is polygonal if the workpiece is polygonal.

Exposure of workpiece W by the contact exposure device shown in of FIGS. 7(a) & 7(b) is explained below.

(1) Mask M is brought into contact with positioning member 1 and is placed on the mask stage MS. Next, a vacuum is supplied to vacuum groove 3 and the mask M is attached/held to the mask stage MS.

(2) Workpiece W is placed on the workpiece stage WS, a vacuum is supplied to the groove 5 from a vacuum source and workpiece W is attached/held on workpiece stage WS.

(3) Workpiece stage WS is raised by workpiece stage drive mechanism 8 and the workpiece W is brought into contact with mask M. Mask M and workpiece W are then positioned in parallel by interval setting groove 7 (consult the gazette of Japanese Kokai Publication Hei-7-74096 and corresponding U.S. Pat. No. 5,543,890 for parallel positioning of mask M and workpiece W).

(4) Following parallel positioning of mask M and workpiece W, the workpiece stage WS is lowered slightly and the gap between mask M and workpiece S is set to an alignment gap. An alignment mark inscribed on mask M and workpiece S is detected by an alignment microscope (not shown), and workpiece stage WS is moved in XYθ directions the by workpiece stage drive mechanism 8 so that both alignment marks coincide, thereby completing alignment of mask M and workpiece W.

(5) Following completion of alignment, workpiece stage WS is elevated to bring mask M into contact with the workpiece W.

Here, mask M and workpiece W are merely brought into mutual contact. Mask M and workpiece W cannot be adhered along the entire surface if slight unevenness or warping are present on the mask M and workpiece W. Accordingly, unevenness may develop in the gap between mask M and workpiece W in some cases, as shown in an exaggerated manner in FIG. 8.

Figure 8:
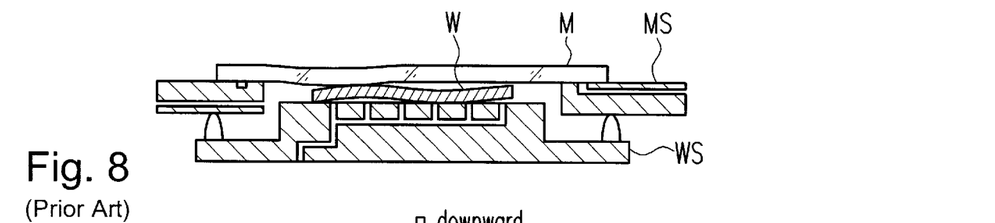
FIG. 8 is a diagram showing the state of a known device in which a mask and workpiece are not adhered.

When exposure is carried out in the aforementioned state, the exposure accuracy following exposure processing (pattern shape following developing) varies with the site of the exposure region. Thus, force is applied between mask M and workpiece W so as to push them together, as explained below, since mask M and workpiece W are adhered over the entire surface.

(6) Vacuum seal unit 6 mounted about the periphery of workpiece stage WS contacts the lower surface of mask stage MS when workpiece stage WS is raised and mask M is brought into contact workpiece W. A sealing space is created by mask M, mask stage MS, workpiece W, workpiece stage WS and vacuum seal unit 6. A vacuum is supplied to conduit 4 mounted in mask stage MS in this state and the aforementioned sealing space is depressurized.

Figure 9:
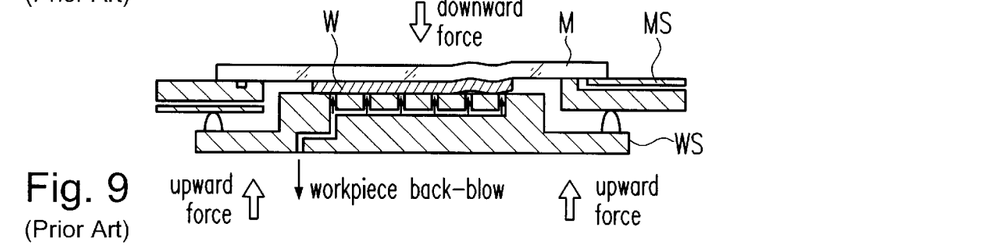
FIG. 9 is a diagram showing the state of a know device in which the space formed by a vacuum seal unit is depressurized to adhere a mask and workpiece.

(7) Upon depressurization of the sealing space, mask M is pushed against workpiece W and mask M is adhered to workpiece W over the entire surface, as shown in FIG. 9.

(8) Workpiece W is irradiated through mask M by a photo-irradiation unit with light containing exposure light while mask M is adhered to workpiece W as mentioned above to complete exposure.

Figure 10:
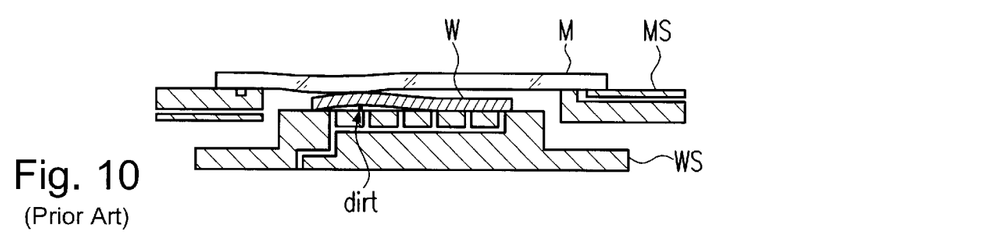
FIG. 10 is a diagram for showing the effect when rubber, etc., is present on a known workpiece stage during adherence of a mask and workpiece.

In conventional contact exposure, as mentioned above, the space between mask M and workpiece W is depressurized, force is applied to mask M and the shape of mask M is altered so as to match the shape of the workpiece W. Workpiece W is then held between mask M and workpiece stage WS and adhered. However, if even a slight amount of dirt is present on workpiece stage WS in the aforementioned conventional example, the workpiece W would be deformed as shown in FIG. 10. Accordingly, force would be concentrated at the section of contact between mask M and the deformed section of workpiece W when mask M is adhered to workpiece W, and the expensive mask M would be damaged. Exposure using a damaged mask would result in the copying of that damage directly to workpiece W, resulting in a defective product.

Furthermore, there is a danger of the workpiece W breaking since a concentrated force is applied even to deformed sections of workpiece W. In particular, thin workpieces W having thickness on the order of 100 to 50 μm, like flexible printed circuits (FPC) having polyimide properties, have come into use in recent years while a tendency to increased contact force between mask M and workpiece W has developed accompanying the demand for high resolution. This has increased the danger of breakage of the workpiece W.

Thus, the inventors have proposed a method of contact exposure which separates and mutually faces a mask and workpiece so that the two maintain a gap without contact upon depressurization of the space between mask and workpiece to a level of force that permits the desired contact force to be reached. The space between a mask and workpiece is depressurized, the two are brought together, and the workpiece is then floated up by air from the workpiece stage to adhere the mask to the workpiece. That is followed by exposure. (See the gazette of Japanese Kokai Publication Hei-10-119032, U.S. patent application Ser. No. 09/299,748 and published European Patent Application EP 0953878A.

Figure 11:
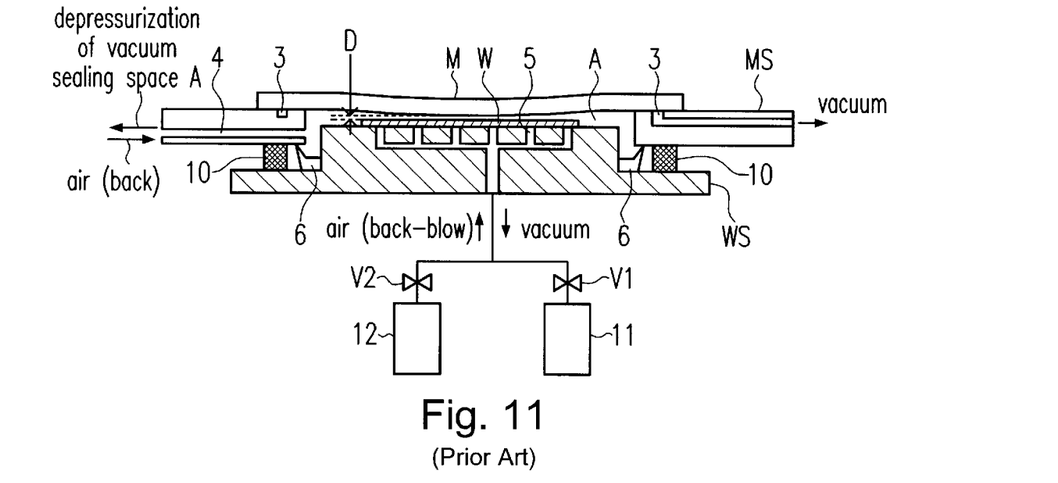
FIG. 11 diagram showing the structure of a known contact exposure device using a backup ring.

FIG. 11 is a diagram showing the structure of a contact exposure device that completes the aforementioned contact exposure. The sections that are identical with those in FIG. 7 have the same notation.

Vacuum groove 3 is mounted about the periphery of the aperture in the mask stage MS in FIG. 11. Mask M is attached/held on mask stage MS by vacuum that is supplied to vacuum adsorption groove 3 that is mounted on the surface of mask stage MS. Furthermore, conduit 4 is provided in mask stage MS so as to depressurize the space A that is formed by mask M, mask stage MS, workpiece W, workpiece stage WS and vacuum seal unit 6. Groove 5 is provided in the workpiece stage WS to attach workpiece W to workpiece stage WS and to float the workpiece W by blowing a gas, such as air, against the workpiece W.

The groove 5 is connected to vacuum pump 11, compressor 12 via valves V1, V2. Workpiece W is attached/held on workpiece stage WS by closing valve V2 and opening the valve V1 and then drawing a vacuum in the groove 5. In addition, the workpiece W is floated by providing air from compressor 12 to the groove 5 by closing valve V1 and opening valve V2, so that the workpiece W is pushed against the side of mask M (the provision of air to the workpiece stage W and the floating of the workpiece W from workpiece stage WS is termed back-blow of the workpiece W).

The vacuum seal unit 6 comprises a sealing member formed, for example, of rubber, that is mounted about the periphery of workpiece stage WS and is useful for creating a vacuum state to adhere the mask M to the workpiece W.

In addition, just as in FIG. 6, the workpiece stage WS is attached to a workpiece stage drive mechanism (not shown) via an interval setting groove (not shown). The workpiece stage drive mechanism moves workpiece stage WS in the X direction (for example, left-right direction of the diagram), Y direction (for example, perpendicularly to the plane of paper in the diagram), and Z direction (up-down in the diagram), and rotates workpiece stage WS about the axis perpendicular to the plane of workpiece W. Furthermore, the interval setting means 10 that sets a gap between the mask M and the workpiece W (hereinafter abbreviated backup ring 10) is mounted about the periphery of workpiece stage WS. The upper surface of backup ring 10 is finely machined. When workpiece stage WS floats, the upper surface of backup ring 10 makes contact with the lower surface of mask stage MS.

The backup ring 10 functions as follows.

[1] The lower surface of mask M and the upper surface of workpiece W are separated and mutually faced at a prescribed gap by bringing backup ring 10 into contact with the lower surface of the mask stage.

[2] The movement of workpiece stage WS in the direction of mask stage MS during depressurization of sealing space A is prevented by pushing at atmospheric pressure. As a result, gap D between workpiece W and mask M can be shortened during depressurization of sealing space A as compared to the distance during aforementioned separation and mutual facing, and the mask and workpiece can be held at a distance such that contact is not made.

[3] Workpiece stage WS and mask stage MS are held in parallel. Contact exposure in FIG. 11 is carried out as follows.

The alignment gap between mask M and workpiece W is set following parallel positioning of mask M and workpiece W by bringing the lower surface of mask stage MS into contact with the upper surface of backup ring 10 to complete alignment between a mask and workpiece.

Next, workpiece stage WS is elevated and backup ring 10 is brought into contact with the lower surface of mask stage MS. In this state, the space between mask M and workpiece W is depressurized to the force capable of attaining the desired contact force. Mask M flexes in the direction of workpiece W upon depressurization of the space between mask M and workpiece W, but mask M and workpiece W do not make contact since backup ring 10 lies between mask stage MS and workpiece stage WS and the desired gap can be maintained. Subsequently, workpiece W is floated by air from workpiece stage WS (back-blow of workpiece W), mask M and workpiece W are adhered and then exposed.

By adopting the aforementioned technique, a mask and workpiece can be adhered and exposed without fear of damaging the mask and without breaking the workpiece.

Incidentally, backup ring 10 must be selected such that the height of gap D reaches a prescribed value as a function of the thickness of workpiece W when processing workpiece W having different thicknesses, as shown in FIG. 11. However, backup ring 10 is usually attached to workpiece stage WS by a screw. Replacement of backup ring 10 requires releasing the screw and detaching backup ring 10, followed by setting a new backup ring in place and screwing it in. The problem is that this replacement operation takes time. Furthermore, the need to prepare a plurality of backup rings imposes an added expense, and an additional problem is the need to secure a storage site for them.

SUMMARY OF THE INVENTION

The present invention was devised in light of aforementioned circumstances. It provides a contact exposure device which does not require replacement of a backup ring even when processing workpieces of different thicknesses.

To solve aforementioned problem, the present invention comprises a first member in which an interval setting means commensurate with aforementioned backup ring is attached to a workpiece stage or a mask stage, and a second member that can move vertically relative to the first member. As a result, the interval between the mask and workpiece can be adjusted to the prescribed value without replacing the interval setting means when treating workpieces of varying thicknesses.

Accordingly, the backup ring need not be replaced when processing workpieces of different thickness as in a conventional example, and that permits the operational efficiency to be improved. Furthermore, replacement backup rings need not be prepared and that permits the cost to be reduced.

DETAILED DESCRIPTION OF THE INVENTION

Figure 1:
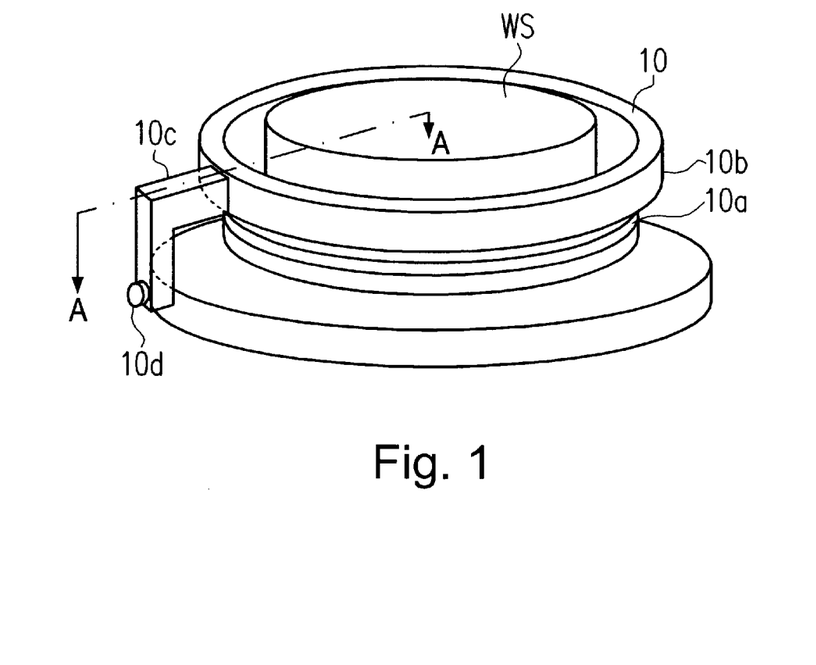
FIG. 1 is a perspective view of an interval setting means in accordance with a embodiment of the present invention.

In the following description the mask/workpiece interval setting means is referred to as backup ring and structures not shown in the FIG. 1 are identical with those in FIG. 11 described above. For example, a workpiece is held by vacuum and floated by a gas such as air is mounted on workpiece stage WS, as shown in FIG. 11, via a that groove is connected to a vacuum pump 11 and compressor 12 via valves V1, V2, respectively, and a seal unit 6 formed of rubber or the like is mounted about the periphery of workpiece stage WS.

In addition, workpiece stage WS is attached to a workpiece stage drive mechanism via interval setting groove as described relative to FIG. 7(b). The workpiece stage drive mechanism moves workpiece stage WS in the X direction (for example, left-right direction of the diagram), Y direction (for example, perpendicularly to the plane of paper in the diagram), and Z direction (up-down in the diagram), and rotates workpiece stage WS about an axis perpendicular to the plane of workpiece W (This rotation is termed movement in direction θ).

A backup ring 10 comprises an attachment member 10a (first member) that is attached to the workpiece stage WS via screws (one of which is shown in phantom outline in FIG. 2), and a movable member 10b (second member). An arm 10c is attached to movable member 10b and a set screw 10d is threaded into arm 10c for both movement and attachment.

The mask stage is not shown in FIG. 1, but a mask stage on which a mask is laid is mounted on workpiece stage WS just as in FIG. 11. Attachment member 10a of the backup ring 10 is structured so as to be attached to the mask stage MS.

Figure 2:
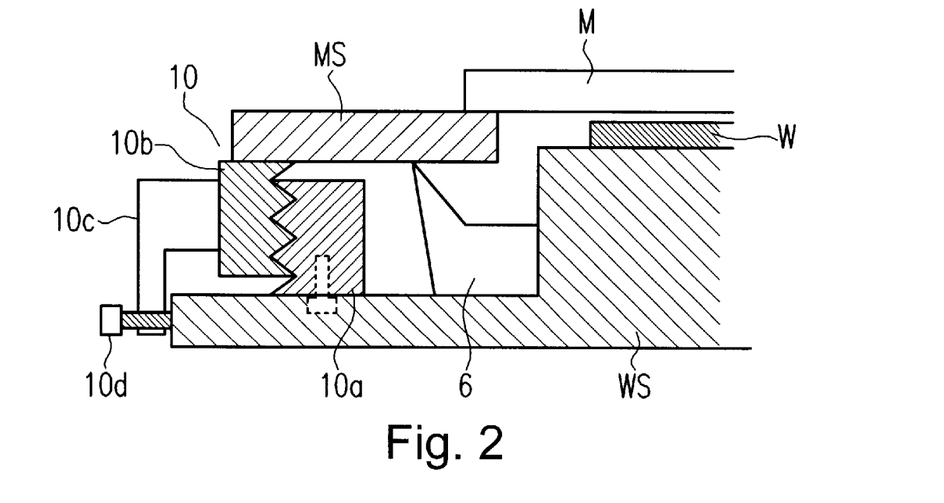
FIG. 2 is a cross-sectional view a portion of an interval setting means in accordance with the first embodiment of the present invention.

In addition to the structures shown in FIG. 1, FIG. 2 shows the mask stage MS, the mask M, the workpiece W and the vacuum seal unit 6. As shown in FIG. 2, attachment member 10a and movable member 10b of backup ring 10 are engaged with each other via a close-tolerance screw threading. Movable member 10b is moved in the vertical direction by rotating the movable member 10b after backing off the set screw 10d. After the movable member 10b has been set at a prescribed height, the set screw 10d is rotated and the tip of the screw is brought into contact with the side of workpiece stage WS to fix it so that the position of movable member 10b does not shift. The height of movable member 10b may be adjusted automatically by connecting it to the rotating shaft of a motor.

Next, the exposure process using the contact exposure device in this working example is explained using aforementioned FIG. 11, FIG. 1 and FIG. 2.

(1) Set screw 10d is released and the movable member 10b is rotated, thereby adjusting the height of movable member 10b as a function of the thickness of workpiece W. Then, the position of movable member 10b is fixed with set screw 10d.

(2) Mask M is laid on mask stage MS. A vacuum is applied to vacuum groove 3 of mask stage MS to attach/hold mask M to mask stage MS.

(3) Workpiece W is laid on workpiece stage WS, valve V1 is opened, valve V2 is closed, and a vacuum is provided to groove 5 of workpiece stage WS from vacuum pump 11, thereby attaching/holding workpiece W to workpiece stage WS.

(4) The workpiece stage WS is raised by a workpiece stage drive mechanism, e.g., 8 as shown in FIG. 7(b). By so doing, the upper surface of backup ring 10 is brought into contact with the lower surface of mask stage MS. Workpiece stage WS and mask stage MS are parallel positioned by a interval setting mechanism, e.g., 7 as shown in FIG. 7(b).

Backup ring 10 is mounted between mask stage MS and workpiece stage WS. Since mask M cannot directly contact workpiece W, workpiece stage WS is raised and the inclination of workpiece stage WS is adjusted by the interval setting mechanism in aforementioned parallel positioning so that the entire upper surface of backup ring 10 contacts the lower surface of mask stage MS, and parallel positioning is carried out.

(5) Workpiece stage WS is lowered and the gap between mask M and workpiece W is set to the alignment gap. The alignment marks inscribed on mask M and workpiece W are detected by the alignment microscope that is not shown. Workpiece stage WS is moved in the XYθ direction by the workpiece stage movement mechanism so that both alignment marks will coincide, and mask M is thereby aligned with workpiece W.

(6) After alignment is completed, the workpiece stage WS is raised and the upper surface of backup ring 10 is brought into contact with the lower surface of mask stage MS. By so doing, the prescribed gap between the lower surface of mask M and the upper surface of workpiece W is maintained. The size of aforementioned prescribed gap can be altered by altering the height of backup ring 10 as noted above.

Figures 3A, 3B:
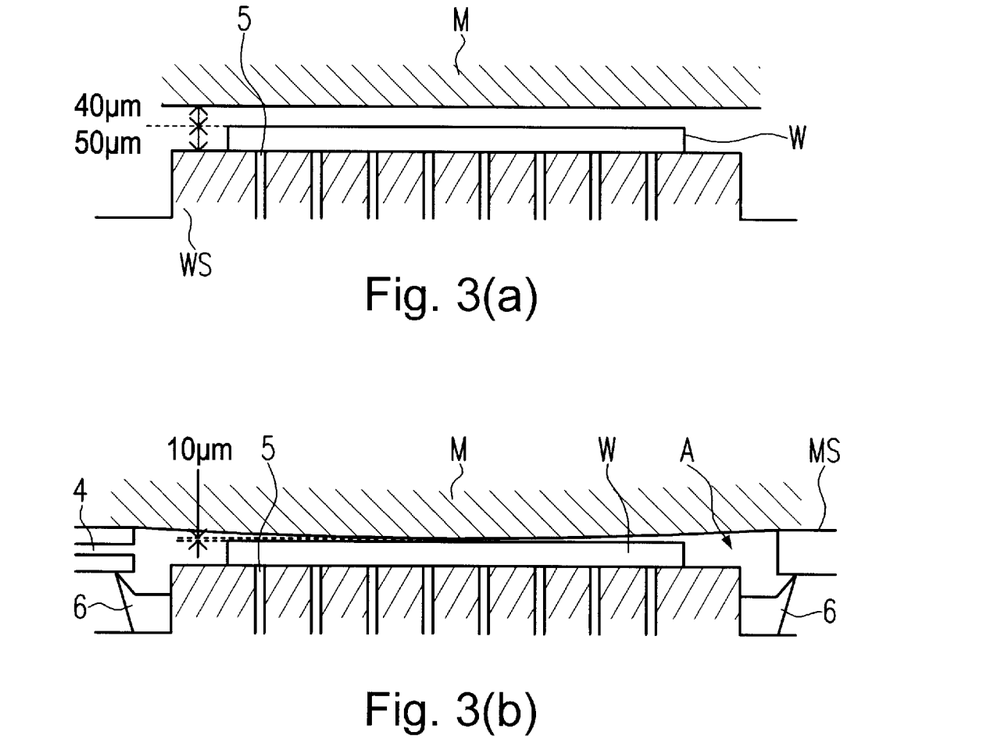
FIGS. 3(a) & 3(b) are diagrams depicting the spatial relationship between a mask and workpiece in accordance with the present invention.

The gap between the mask M and workpiece W is set as shown in FIG. 3(a). Specifically, the gap between the mask stage MS and the workpiece stage WS is set so that the gap between the lower surface of mask M and the upper surface of workpiece W would be 40 μm when the thickness of workpiece W is about 50 μm.

(7) The vacuum seal unit 6 mounted about the periphery of workpiece stage WS makes contact with the lower surface of mask stage MS when the upper surface of backup ring 10 is brought into contact with the lower surface of mask stage MS, and sealing space A is formed by mask M, mask stage MS, workpiece W, workpiece stage WS and vacuum seal unit 6. In this state, a vacuum is connected to conduit 4 mounted in mask stage MS and sealing space A is depressurized. Specifically, mask M is depressed at atmospheric pressure, as shown in FIG. 3(b), by depressurization of sealing space A causing it to flex it in the direction toward the workpiece W. The workpiece stage WS is also depressed by atmospheric pressure similarly to mask M and force is imposed in the direction of mask stage MS at the top of the figure, but workpiece stage WS does not move because of backup ring 10. Accordingly, the gap between mask M and workpiece W is held at about 10 μm at the center of the mask as shown in FIG. 3(b), since mask M does not make contact with workpiece W.

Figure 4:
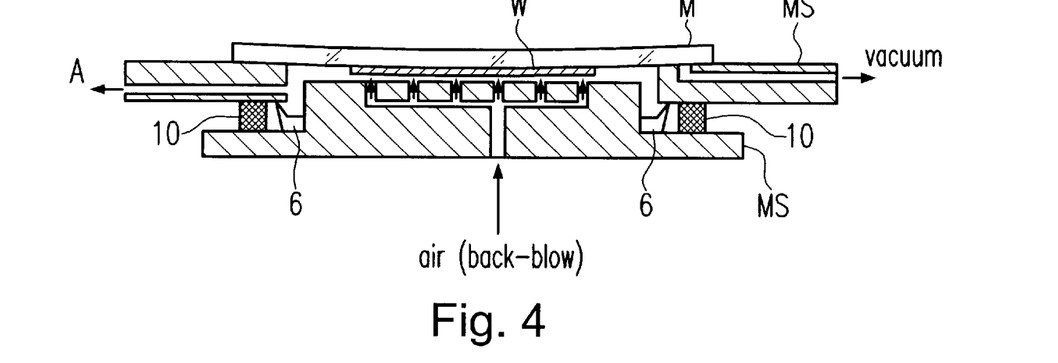
FIG. 4 is a cross-sectional view showing vacuum attachment of the mask and workpiece with back-blow in accordance with the present invention.

(8) Valve V1 is closed, valve V2 is opened and air is provided to groove 5 in workpiece stage WS. Workpiece W is floated above workpiece stage WS and is pressed against mask M (back-blow of workpiece W). By so doing, mask M is adhered to workpiece W, as shown in FIG. 4. If back-blow of workpiece W and mask M is carried out without depressurization of the sealing space A, workpiece W could not be adhered to mask M. The reason is that an air pocket would form between workpiece W and mask M when workpiece W is pushed against mask M. In contrast, air in the space would be vented when adhering workpiece W to mask M and formation of a residual air pocket would be prevented by depressurizing sealing space A in above mentioned manner.

The mode of contact between workpiece W and mask M via back-blow is explained below.

Figure 5:
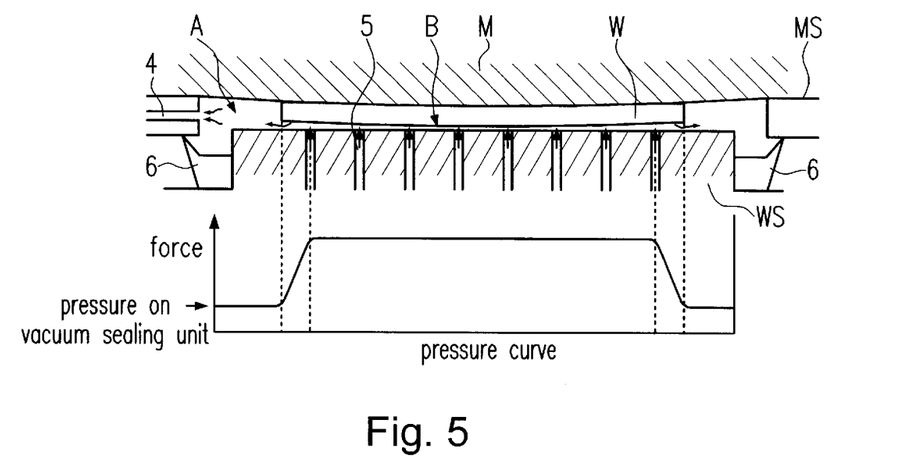
FIG. 5 is diagram showing the state of a workpiece during back-blow and the associated pressure curve in accordance with the present invention.

A space B virtually enclosed by workpiece stage WS and workpiece W is formed by back-blow, as shown in FIG. 5, and the force of space B is higher than that of sealing space A. The force relationship is shown at the bottom of FIG. 5. Specifically, back-blow air flows from the gap between the tip of workpiece W and workpiece stage WS in the direction of sealing space A (leaks), but the gap in that space is smaller than 40 μm since mask M flexes in the direction of workpiece W.

Accordingly, conductance between the tip of workpiece W and workpiece stage WS rises so that back-blow air does not leak to sealing space A. Accordingly, the force distribution at the lower surface of workpiece W reaches a virtual plateau, as shown in FIG. 5. The force due to back-blow that is generated in space B enclosed by the workpiece stage WS and workpiece W is held over virtually the entire surface of workpiece W so that workpiece W is pushed against mask M. In addition, flexing of mask M decreases due to the back-blow so that mask M and workpiece W move slightly upward.

The force with which workpiece W is pushed against mask M is weakened since the pressure at the periphery of workpiece W through which air leaks approaches the pressure at sealing space A. Accordingly, the adherence with mask M worsens with the pressure curve in FIG. 4, but no problem arises even if workpiece W and mask M are not adhered since a pattern such as a usual circuit is not formed at the periphery of workpiece W.

(9) In this state, light including exposure light is radiated from the photo-irradiation unit (not shown) through mask M to workpiece W, and exposure is carried out.

The above explanation addresses the case in which the gap between mask M and workpiece W is set at 40 μm, but if the gap between mask M and workpiece W becomes too wide, workpiece W would move in the transverse (XY) direction during back-blow of workpiece W, while mask M would make contact with workpiece W during depressurization of vacuum seal unit 6 if the gap between mask M and workpiece W is too narrow, and that presents the danger of mask M damage or workpiece W breakage.

Accordingly, the ideal conditions, including the pressure of sealing space A and the back-blow pressure, must be determined in consideration of the size of workpiece W, its thickness and the thickness of mask M, and the gap between mask M and workpiece W must be set.

In general, the pressure (degree of vacuum) at sealing space A is determined based on the contact force that was determined since the contact force of mask M and workpiece W is dependent on the pressure of aforementioned sealing space A (degree of vacuum). The amount of flexing of the mask M is determined from the pressure of sealing space A, the size and thickness of workpiece W, and the thickness of mask M, and the gap between mask M and workpiece W may be set so that mask M does not contact workpiece W when mask M is flexed through depressurization of sealing space A.

A workpiece of thin steel foil of φ150 mm is used in this working example. With a mask thickness of 3.8 mm, the pressure at the vacuum sealing unit 6 is set at 20 kPa (20 kPa is about 150 mmHg since 1 atmosphere=76 mmHg=101.3 kPa), the back-blow pressure is 2 kPa, and the gap between the lower surface at the center of the mask and the upper surface of the workpiece is 40 μm. At that time, the gap between mask M and workpiece W upon depressurization would be about 10 μm, and that permits accurate exposure processing.

FIG. 6 is a diagram showing the structure of the interval setting means in accordance with a second embodiment of the present invention. Structures other than those that are shown are identical with those in first embodiment.

Figure 6A:
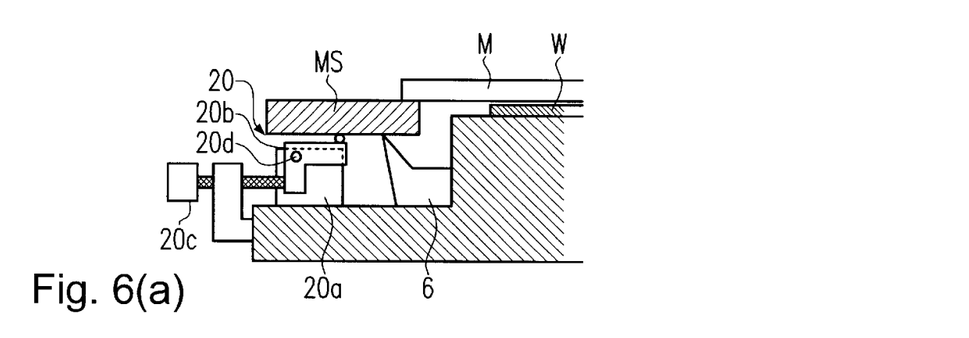
FIG. 6 is a cross-sectional view a portion of an interval setting means in accordance with the second embodiment of the present invention.
Figure 6B:
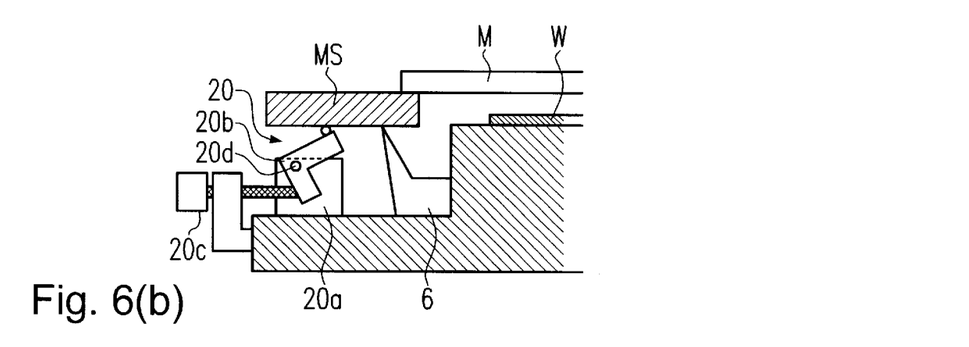

The interval setting means 20 in this embodiment comprises an attachment member 20a (first member) that is attached to workpiece stage WS, a movable member 20b (second member) and a micrometer 20c. At least three such interval setting means 20 are mounted about the periphery of the workpiece stage. The movable member 20b is pivotably attached to the attachment member 20a so as to rotate about a pivot pin 20d. The height can be adjusted through pivoting of the movable member 20b, as shown in FIGS. 6(a) & 6(b). Adjustment in the vertical direction is accomplished by adjusting the inclination of movable member 20b of the three sets of interval setting means 20 that are mounted about the periphery of the workpiece stage WS. Mask M and workpiece W are adjusted in parallel so that their gap reaches a preset value.

The exposure process following setting of the interval setting of mask M and the workpiece W by the interval setting means 20 is identical with that in aforementioned first working example. Workpiece W is then exposed through processes steps (2)–(9) as mentioned above.

As indicated above, the shape of the interval setting means need not be round as shown in the first embodiment. A means comprising a first member and a second member having adequate strength relative to the load imposed on each interval setting means that is disposed so as to be uniform at three or more locations about the periphery of the workpiece stage during depressurization, as in aforementioned second working example, is permissible.

In addition, various means may be used as interval setting means, including a piezo device whose length changes as a function of voltage to permit adjustment of the height by voltage alteration.

Effects of Invention

A means of setting the gap between a mask and workpiece comprises a first member that is attached to a workpiece stage or a mask stage and a second member whose position can be adjusted in the vertical direction in a contact exposure device of the present invention, as explained above. The gap between a mask and workpiece can be adjusted to a prescribed value without replacing the interval setting means when processing workpieces having different thicknesses. Accordingly, the operational efficiency can be improved and the cost can be reduced since replacement backup rings need not be prepared as in the conventional case.

What is claimed is:

1. A contact exposure device of the type having a workpiece stage on which a workpiece with a photosensitive film clad on the surface thereof is placed, a mask stage for holding a mask on which a mask pattern is formed through which the workpiece is irradiated with light containing exposure light to expose the mask pattern upon the workpiece, and means for drawing a vacuum in a space between the mask and workpiece, the improvement comprising an interval setting device positioned for providing a preset contact-free interval between the mask and workpiece when said vacuum is drawn in the space between the mask and workpiece reducing the distance therebetween, said interval setting means comprising a first member that is attached to one of the workpiece stage and the mask stage, and a second member that can move vertically relative to said first member for enabling altering said interval as a function of the thickness of individual workpieces.

2. Contact exposure device according to claim 1, wherein the first member is connected to the second member by a threading for producing relative vertical movement by rotation of the second member relative to the first member; and wherein the second member is provided with a means for fixing the second member relative to the first member in a desired position.

3. Contact exposure device according to claim 1, wherein the second member has first and second lever arms pivotally connected to the second member between said lever arms; wherein the mask stage is support on said first lever arm; and wherein displacement means is engageable with the second member for pivoting thereof.

* * * * *